(12) United States Patent
Ishii

(10) Patent No.: US 7,302,910 B2
(45) Date of Patent: *Dec. 4, 2007

(54) PLASMA APPARATUS AND PRODUCTION METHOD THEREOF

(75) Inventor: Nobuo Ishii, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

This patent is subject to a terminal disclaimer.

(21) Appl. No.: 10/467,821

(22) PCT Filed: Feb. 15, 2002

(86) PCT No.: PCT/JP02/01287

§ 371 (c)(1),
(2), (4) Date: Jan. 23, 2004

(87) PCT Pub. No.: WO02/065533

PCT Pub. Date: Aug. 22, 2002

(65) Prior Publication Data

US 2004/0112292 A1    Jun. 17, 2004

(30) Foreign Application Priority Data

Feb. 16, 2001    (JP) ............... 2001-040576

(51) Int. Cl.
- C23C 16/00 (2006.01)
- C23F 1/00 (2006.01)
- H01L 21/306 (2006.01)

(52) U.S. Cl. ............... 118/723 MW; 118/723 AN; 156/345.41

(58) Field of Classification Search ....... 118/723 MW; 156/345.36, 345.41
See application file for complete search history.

(56) References Cited

U.S. PATENT DOCUMENTS

| 4,785,763 A | 11/1988 | Saitoh |
| 4,985,109 A * | 1/1991 | Otsubo et al. ......... 156/345.41 |
| 5,556,475 A * | 9/1996 | Besen et al. .......... 118/723 MP |
| 5,587,205 A | 12/1996 | Hiroshi et al. |
| 6,364,958 B1 * | 4/2002 | Lai et al. ..................... 118/728 |

(Continued)

FOREIGN PATENT DOCUMENTS

EP    1315201 A1    5/2003

(Continued)

OTHER PUBLICATIONS

European Search Report dated Jan. 24, 2006 (Six (6) Pages).

*Primary Examiner*—Parviz Hassanzadeh
*Assistant Examiner*—Rakesh K. Dhingra
(74) *Attorney, Agent, or Firm*—Crowell & Moring LLP

(57) ABSTRACT

A plasma apparatus includes a container (11) having an opening, a dielectric member (13) supported by an end surface of an outer periphery of the opening of the container (11), an electromagnetic field supplying means for supplying an electromagnetic field into the container (11) through the dielectric member (13), and a shield member (12) covering the outer periphery of the dielectric member (13) and shielding the electromagnetic field. A distance $L_1$ from an inner surface of the container (11) to an inner surface of the shield member (12) at an end surface of the container (11) is approximately N/2 (N is an integer not smaller than 0) times the wavelength of the electromagnetic field in an area (18) surrounded by the end surface of the container (11), the electromagnetic field supplying means and the shield member (12).

3 Claims, 6 Drawing Sheets

U.S. PATENT DOCUMENTS

2002/0066536 A1 * 6/2002 Hongoh et al. ........ 156/345.41

FOREIGN PATENT DOCUMENTS

| JP | 7-335631 A | 12/1995 |
| JP | 10-199698 A | 7/1998 |
| JP | 11-67492 | 3/1999 |
| JP | 11-195500 | 7/1999 |
| JP | 11-340204 | 12/1999 |

* cited by examiner

PLASMA APPARATUS AND PRODUCTION METHOD THEREOF

TECHNICAL FIELD

The present invention relates to a plasma apparatus generating plasma by an electromagnetic field supplied to a container and to a method of manufacturing the same.

BACKGROUND ART

Plasma apparatuses are widely used in manufacturing semiconductor devices and flat panel displays, to perform processes such as oxide film formation, crystal growth of a semiconductor layer, etching and ashing. Among such plasma apparatuses, there is a high frequency plasma apparatus that supplies a high frequency electromagnetic field to a container using an antenna, and generates high frequency plasma using the electromagnetic field. The high frequency plasma apparatus is capable of generating plasma stably even when plasma gas pressure is relatively low, and hence, application thereof is wide.

FIG. 8 shows an exemplary configuration of a conventional high frequency plasma apparatus. This figure shows some parts in vertical cross section. FIGS. 9A and 9B are cross sections showing, in enlargement, the portion IX surrounded by dotted lines in FIG. 8.

As shown in FIG. 8, the plasma apparatus has a cylindrical processing container 511 with a bottom, opened at the upper portion. At the bottom of processing container 511, a mounting table 522 is fixed, and a substrate 521 is placed on an upper surface of mounting table 522. On a sidewall of processing container 511, a gas supply nozzle 517 is provided, and at the bottom of processing container 511, an exhaust port 516 is provided for vacuum evacuation. At the upper opening of processing container 511, a dielectric plate 513 is arranged, and at a joint portion between an upper surface of the sidewall of processing container 511 and a peripheral portion of a lower surface of dielectric plate 513, an O-ring 514 as a sealing member is interposed, to attain tight sealing of the joint portion.

On dielectric plate 513, a radial antenna 530 is arranged. At the central portion of radial antenna 513, a high frequency generator 545 generating a high frequency electromagnetic field is connected by a wave-guide. At the upper surface of the sidewall of processing container 511, an annular shield member 512 is arranged. Shield member 512 covers an outer periphery of dielectric plate 513 and radial antenna 530, so as to prevent leakage of the electromagnetic field to the outside of processing container 511.

Of the electromagnetic field emitted from radial antenna 530, an electromagnetic field F that has passed through dielectric plate 513 and introduced to processing container 511 causes electrolytic dissociation of a gas in processing container 511, to generate plasma in an upper space S2 above substrate 521. Here, an electromagnetic field F1 that is not absorbed by the plasma and reflected and an electromagnetic field F2 not directly introduced from radial antenna 530 to processing container 511 are repeatedly reflected in an area S1 between an emitting surface of radial antenna 530 and a plasma surface, forming a standing wave. The standing wave also takes a part in the generation of plasma.

In the conventional plasma apparatus, when shield member 512 is arranged at an upper surface of the sidewall of processing container 511, a distance $L_1$ from an edge 511A of an inner surface of the sidewall of processing container 511 to an inner surface of shield member 512 is not at all considered. It is noted, however, that when wavelength of an electromagnetic field in a recessed portion 518 (dotted area in FIGS. 9A and 9B) formed by the upper surface of the sidewall of processing container 511, the emitting surface of radial antenna 530 and the inner surface of shield member 512 is given as λg and the distance $L_1$ is approximately $\lambda_g/4$ as shown in FIG. 9A, the voltage at the position of edge 511A becomes large, possibly resulting in an abnormal discharge, as the position of edge 511A, that is the opening of recessed portion 518, corresponds to the bulged portion of the standing wave. If such an abnormal discharge occurs, metal atoms of processing container 511 may be dissociated, causing contamination in processing container 511.

In the conventional plasma apparatus, a distance $L_2$ from the inner surface of shield member 512 to the position where O-ring 514 is arranged is not at all considered, either. When the distance $L_2$ is approximately $\lambda_g/4$, elasticity of O-ring 514 degrades because of the strong electromagnetic field of the standing wave, and the life of O-ring 514 becomes shorter.

DISCLOSURE OF THE INVENTION

The present invention was made to solve the above described problem, and its object is to suppress contamination in the container in which plasma is generated.

Another object is to elongate life of a sealing member such as the O-ring.

In order to attain these objects, the present invention provides a plasma apparatus, including: a container having an opening; a dielectric member supported by an end surface of an outer periphery of the opening of the container and closing the opening; electromagnetic field supplying means for supplying an electromagnetic field from the opening into the container through the dielectric member; and a shield member extending at least between the end surface of the container and the electromagnetic field supplying means, covering an outer periphery of the dielectric member and shielding the electromagnetic field; wherein the distance from an inner surface of the container at an end surface of the container to an inner surface of the shield member corresponds to approximately N/2 (N is an integer not smaller than 1) times the wavelength of the electromagnetic field in an area surrounded by the end surface of the container, the electromagnetic field supplying means and the shield member. Accordingly, the position of the inner surface of the container approximately corresponds to a node of the standing wave generated in the area mentioned above, and hence, the voltage at this position attains to approximately zero. Thus, abnormal discharge does not occur at this position. The distance is determined in consideration of relative dielectric constant of the dielectric member in the area mentioned above.

Here, desirably, when a distance between an end surface of the container and the antenna is represented by D, relative air density in the area is represented by δ and wavelength of the electromagnetic field in the area is represented by $\lambda_g$, the distance $L_1$ from the inner surface of the container to the inner surface of the shield member satisfy the relation of $$(N/2)\cdot\lambda_g-\Delta L < L_1 < (N/2)\cdot\lambda_g+\Delta L$$

where $$L_1 > 0$$

$$\Delta L = (\theta/360)\cdot\lambda_g$$

$$\theta = \sin^{-1}(1/\Gamma)$$

$$\Gamma = 1 + \{0.328/(\delta \cdot D)^{1/2}\}.$$

Further, a sealing member is interposed at a joint portion between the end surface of the container and the dielectric member for tight-sealing the joint portion, and the sealing member is arranged at a position away from the inner surface of the shield member by a distance approximately M/2 (M is an integer not smaller than 0 and not larger than N) times the wavelength of the electromagnetic field in the area mentioned above. The position where the sealing member is arranged approximately corresponds to the position of a node of the standing wave generated in the area mentioned above, and therefore, the electromagnetic field of the standing wave is weak.

Desirably, when a distance between an end surface of the container and the antenna is represented by D, relative air density in the area is represented by $\delta$ and wavelength of the electromagnetic field in the area is represented by $\lambda_g$, the distance $L_2$ from the inner surface of the shield member to the position of arrangement of the sealing member satisfy the relation of $$(M/2) \cdot \lambda_g - \Delta L < L_2 < (M/2) \cdot \lambda_g + \Delta L$$

where $$L_2 > 0$$

$$\Delta L = (\theta/360) \cdot \lambda_g$$

$$\theta = \sin^{-1}(1/\Gamma)$$

$$\Gamma = 1 + \{0.328/(\delta \cdot D)^{1/2}\}.$$

The plasma apparatus of the present invention includes a container having a through hole formed therein, to which a conductor is inserted; an electromagnetic field supplying means for supplying an electromagnetic field into the container; and a shield member closing the through hole of the container to shield the electromagnetic field; wherein the distance from an inner surface of the container in the through hole of the container to an inner surface of the shield member corresponds to approximately N/2 (N is an integer not smaller than 1) times the wavelength of the electromagnetic field in the through hole. Accordingly, the position of the inner surface of the container approximately corresponds to a node of the standing wave generated in the through hole, and hence, the voltage at this position attains to approximately zero. Thus, abnormal discharge does not occur at this position. An example of a conductor inserted into the through hole includes a probe for measuring plasma density.

Desirably, when diameter of the through hole of the container is represented by D, relative air density in the through hole is represented by $\delta$ and wavelength of the electromagnetic field in the through hole is represented by $\lambda_g$, the distance $L_3$ from the inner surface of the container to the inner surface of the shield member satisfies the relation of $$(N/2) \cdot \lambda_g - \Delta L < L_3 < (N/2) \cdot \lambda_g + \Delta L$$

where $$L_3 > 0$$

$$\Delta L = (\theta/360) \cdot \lambda_g$$

$$\theta = \sin^{-1}(1/\Gamma)$$

$$\Gamma = 1 + \{0.328/(\delta \cdot D)^{1/2}\}.$$

Further, a sealing member tightly sealing the through hole of the container is arranged at a position away from the inner surface of the shield member, at distance corresponding to approximately M/2 (M is an integer not smaller than 0 and not larger than N) times the wavelength of the electromagnetic field in the through hole. The position where the sealing member is arranged approximately corresponds to the position of a node of the standing wave generated in the through hole, and therefore, the electromagnetic field of the standing wave is weak.

Desirably, when diameter of the through hole of the container is represented by D, relative air density in the through hole is represented by $\delta$ and wavelength of the electromagnetic field in the through hole is represented by $\lambda_g$, distance $L_4$ from the inner surface of the shield member to the position of arrangement of the sealing member satisfies the relation of $$(M/2) \cdot \lambda_g - \Delta L < L_4 < (M/2) \cdot \lambda_g + \Delta L$$

where $$L_4 > 0$$

$$\Delta L = (\theta/360) \cdot \lambda_g$$

$$\theta = \sin^{-1}(1/\Gamma)$$

$$\Gamma = 1 + \{0.328/(\delta \cdot D)^{1/2}\}.$$

The present invention provides a method of manufacturing a plasma apparatus, including: a container having an opening; a dielectric member supported by an end surface of an outer periphery of the opening of the container and closing the opening; electromagnetic field supplying means for supplying an electromagnetic field from the opening into the container through the dielectric member; and a shield member extending at least between the end surface of the container and the magnetic field supplying means, covering an outer periphery of the dielectric member and shielding the electromagnetic field; wherein distance from an inner surface of the container at an end surface of the container to an inner surface of the shield member is adjusted to approximately N/2 (N is an integer not smaller than 1) times the wavelength of the electromagnetic field in an area surrounded by the end surface of the container, the electromagnetic field supplying means and the shield member.

Further, a sealing member sealing a joint portion between the end surface of the container and the dielectric member is arranged at a position away from the inner surface of the shield member, at a distance corresponding to approximately M/2 (M is an integer not smaller than 0 and not larger than N) times the wavelength of the electromagnetic field in the area mentioned above.

Further, when the electromagnetic field supplying means is implemented by an antenna positioned opposite to the dielectric member, the wavelength of the electromagnetic field in an area surrounded by the end surface of the container, the antenna and the shield member may be adjusted by changing an interval between the dielectric member and the antenna.

The present invention provides a method of manufacturing a plasma apparatus including: a container having a through hole formed therein, to which a conductor is inserted; an electromagnetic field supplying means for supplying an electromagnetic field into the container; and a shield member closing the through hole of the container to shield the electromagnetic field; wherein distance from an inner surface of the container in the through hole of the container to an inner surface of the shield member is adjusted to approximately N/2 (N is an integer not smaller than 1) times the wavelength of the electromagnetic field in the through hole. An example of a conductor inserted into the through hole includes a probe for measuring plasma density.

Further, a sealing member sealing the through hole of the container is arranged at a position away from the inner surface of the shield member, at a distance corresponding to approximately M/2 (M is an integer not smaller than 0 and not larger than N) times the wavelength of the electromagnetic field in the through hole,

BEST MODES FOR CARRYING OUT THE INVENTION

Next, embodiments of the present invention will be described with reference to the drawings. Here, an example in which the plasma apparatus in accordance with the present invention is applied to an etching apparatus will be described.

First Embodiment

Figure 1:
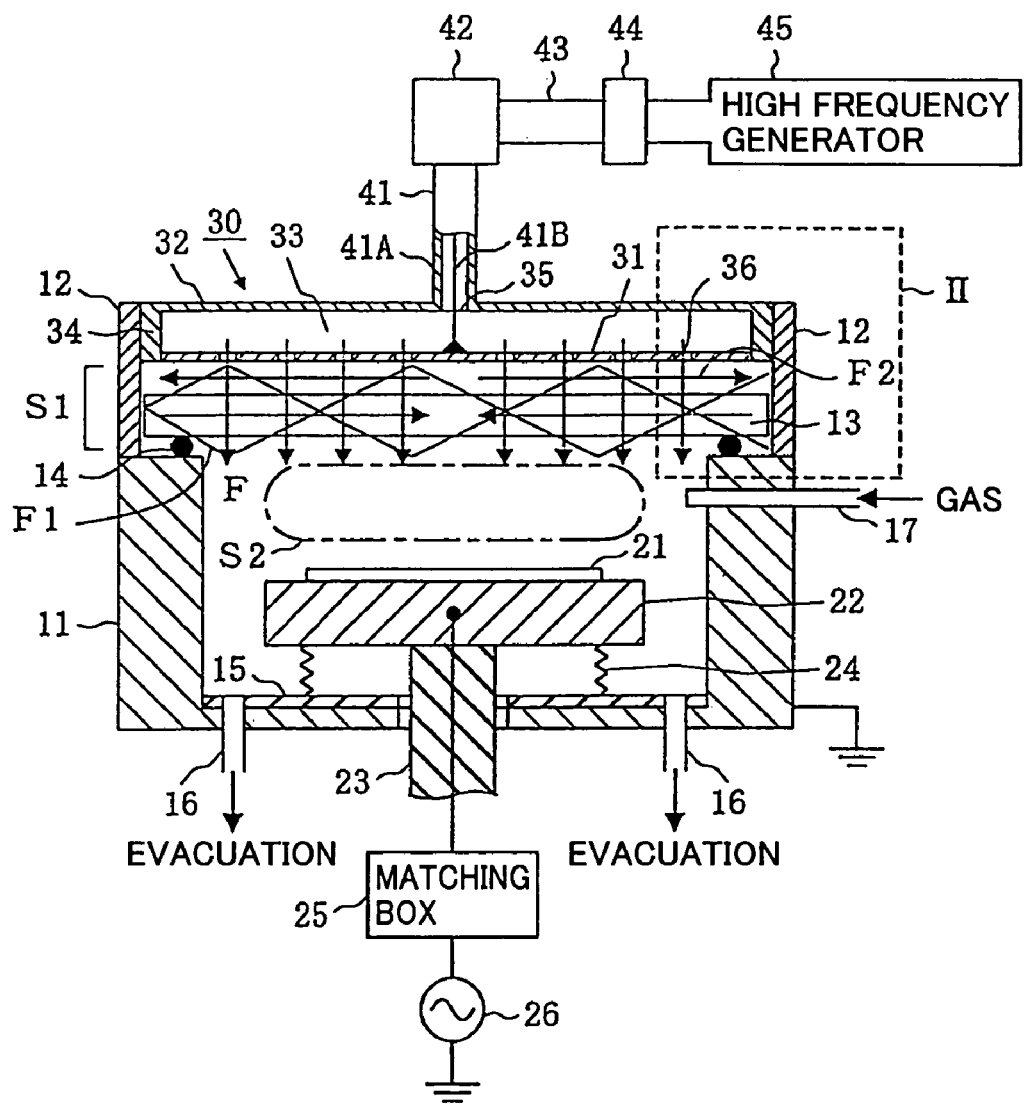
FIG. 1 represents a configuration of an etching apparatus in accordance with a first embodiment of the present invention.

FIG. 1 represents a configuration of an etching apparatus in accordance with a first embodiment of the present invention. This figure shows some parts in vertical cross section.

The etching apparatus includes a cylindrical processing container 11 with a bottom, opened at an upper portion. Processing container 11 is formed of a metal such as aluminum.

At a sidewall of processing container 11, a nozzle 17 is provided for introducing a plasma gas such as Ar and an etching gas such as $CF_4$ into processing container 11. Nozzle 17 is formed, for example, by a quartz pipe.

At the bottom of processing container 11, an insulating plate 15 formed of ceramic or the like is provided. Further, an exhaust port 16 is provided penetrating through insulating plate 15 and the bottom of processing container 11, and by means of a vacuum pump (not shown) communicated with exhaust port 16, the inside of processing container can be evacuated to a desired degree of vacuum.

In processing container 11, a columnar mounting table 22 is contained, on an upper surface of which a substrate 21 as an object of processing is placed. Mounting table 22 is supported by an elevating shaft 23 passing, with a play, through the bottom of processing container 11, to be freely movable upward and downward. Further, to mounting table 22, a biasing high frequency power supply 26 is connected through a matching box 25. Output frequency of high frequency power supply 26 is a prescribed frequency within the range of several hundred kHz to ten and several MHz. In order to ensure air-tightness of processing container 11, a bellows 24 is provided to surround elevation shaft 23, between mounting table 22 and insulating plate 15.

At the opening of processing container 11, a dielectric plate 13 formed of quartz glass or ceramic (for example, $AL_2O_3$, AlN) having the thickness of about 20 to about 30 mm is arranged. Dielectric plate 13 is larger in diameter than the opening, and dielectric plate 13 is supported by an upper surface of the sidewall, that is, an outer periphery of the opening of processing container 11 (end surface of processing container 11). At a joint portion between the upper surface of the sidewall of processing container 11 and a lower surface of a periphery of dielectric plate 13, an O-ring 14 is interposed as a sealing member, to tightly seal the joint portion. O-ring 14 is formed, for example, by Viton (vinylidene fluoride-hexafluoropropylene).

On dielectric plate 13, a radial antenna 30 is arranged, as electromagnetic field supplying means for supplying an electromagnetic field to the inside of processing container 11 through dielectric plate 13. Radial antenna 30 is separated from processing container 11 by dielectric plate 13, and protected from the plasma generated in processing container 11.

Further, on the upper surface of the sidewall of processing container 11, an annular shield member 12 is arranged, covering outer peripheries of dielectric plate 13 and radial antenna 30. Shield member 12 is formed of a metal such as aluminum, and has a function of shielding the electromagnetic field. This shield member 12 prevents leakage of the electromagnetic field to the outside of processing container 11. It is noted that the shielding member may have such a structure that extends at least between the upper surface of the sidewall of processing container 11 and the lower surface of radial antenna 30 and covers the outer periphery of dielectric plate 13.

Radial antenna 30 includes two circular conductor plates 31, 32 parallel to each other and forming a radial wave-guide 33, and a conductor ring 34 connecting peripheral portions of conductor plates 31 and 32. At the central portion of conductor plate 32 serving as an upper surface of radial wave-guide 33, an inlet 35 is formed for introducing the electromagnetic field into radial wave-guide 33, and in conductor plate 31 serving as a lower surface of radial wave-guide 33, a plurality of slots 36 are formed to supply the electromagnetic field propagating through radial wave-guide 33 into processing container 11. Conductor plate 31 serves as the emitting surface of radial antenna 30.

When the wavelength of the electromagnetic field in radial wave-guide 33 is represented as $\lambda_{g1}$, an interval between the slots along the radial direction of conductor plate 31 may be set approximately to $\lambda_{g1}$, to provide a radial type antenna, or the interval may be set approximately to $\lambda_{g1}/20$ to $\lambda_{g1}/30$ to provide a leak type antenna. Conductor plates 31, 32 and conductor ring 34 are formed of a metal such as copper or aluminum.

To the central portion of radial antenna 30, a coaxial line 41 is connected. An outer conductor 41A of coaxial line 41 is connected to inlet 35 of conductor plate 32. An inner conductor 41B of coaxial line 41 has its tip end formed to have a conical shape, and the bottom portion of the cone is connected to the center of conductor plate 31.

Coaxial line 41 connected to the central portion of radial antenna 30 in this manner is connected to a high frequency generator 45 through a rectangular coaxial transducer 42 and a rectangular wave-guide 43. High frequency generator 45 generates a high frequency electromagnetic field of a prescribed frequency (for example, 2.45 GHz) within the range of 1 GHz to ten and several GHz. By providing a matching circuit 44 for impedance matching in the middle of rectangular wave-guide 43, efficiency of power use can be improved. The path from high frequency generator 44 to radial antenna 30 may be connected by a cylindrical wave-guide.

Figure 2:
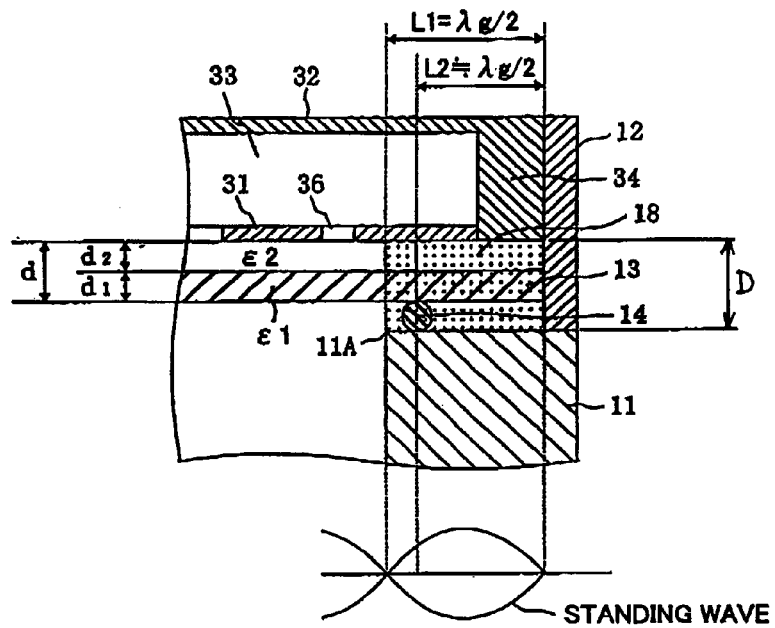
FIG. 2 is a cross section showing, in enlargement, a portion II surrounded by dotted lines in FIG. 1.

FIG. 2 is a cross section showing, in enlargement, a portion II surrounded by dotted lines in FIG. 1.

Wave length of an electromagnetic field in a recessed portion (dotted area in FIG. 2) formed by the upper surface of the sidewall of processing container 11, the emitting surface (conductor plate 31) of radial antenna 30 and the inner surface of shielding member 12 is represented as $\lambda_g$, and shielding member 12 is arranged such that the distance $L_1$ from an edge 11A of the inner surface of the sidewall of processing container 11 to the inner surface of shielding member 12 (that is, the depth from the opening of recessed portion 18 to the end surface) is approximately $\lambda_g/2$. Further, O-ring 41 is arranged at a distance $L_2$, slightly shorter than $\lambda_g/2$, from the inner surface of shielding member 12.

The wavelength $\lambda_g$ of the electromagnetic field in recessed portion 18 is represented in the following manner. First, the thickness and relative dielectric constant of dielectric plate 13 are represented as $d_1$, $\epsilon_1$, the distance and relative dielectric constant between dielectric plate 13 and emitting surface (conductor plate 31) of radial antenna 30 are represented as $d_2$, $\epsilon_2$, and $d_1+d_2=d$. Then, equivalent relative dielectric constant $\epsilon_r$ outside the radial antenna 30 is given by $$\epsilon_r = \epsilon_1 \cdot \epsilon_2 / [\epsilon_1 \cdot (1-\alpha) + \epsilon_2 \cdot \alpha] \quad (1)$$

where $\alpha$ is $d_1/d$, which is referred to as dielectric occupation ratio. When the wavelength of the electromagnetic field in a free space is represented as $\lambda$, the wavelength $\lambda_g$ in recessed portion 18 is given by the following equation, using the equivalent relative dielectric constant $\epsilon_r$.

$$\lambda_g = \lambda/(\epsilon_r)^{1/2} \quad (2)$$

where $1/(\epsilon_r)^{1/2}$ is referred to as shortening coefficient of wavelength.

Figure 3:
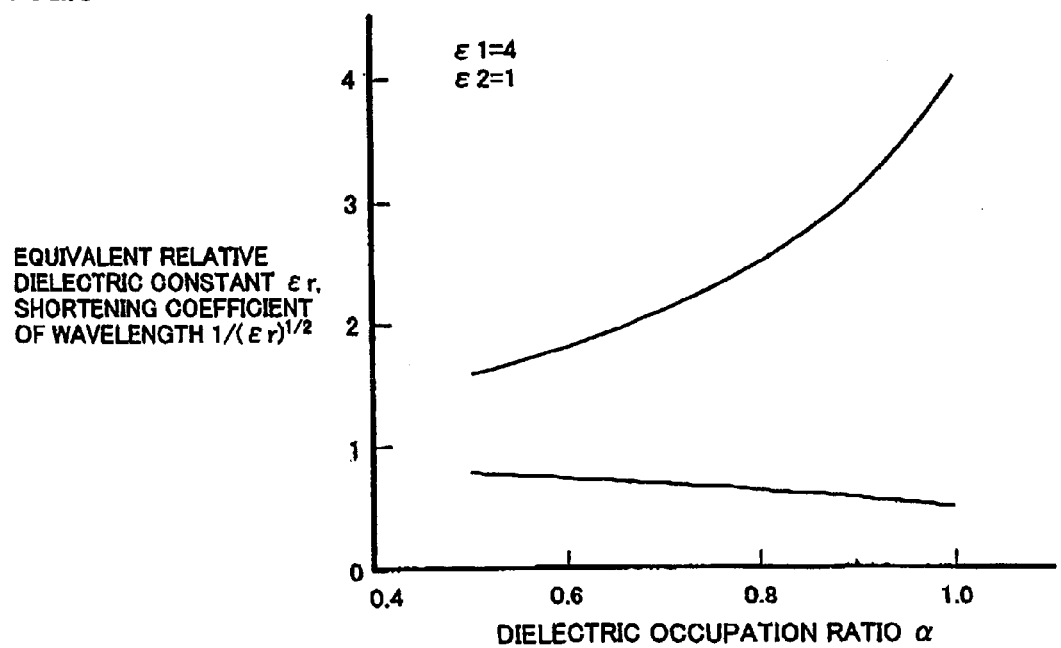
FIG. 3 shows dependency of equivalent relative dielectric constant and shortening coefficient of wavelength on dielectric occupation ratio.

FIG. 3 shows dependency of equivalent relative dielectric constant and shortening coefficient of wavelength on dielectric occupation ratio. The abscissa represents dielectric occupation ratio $\alpha$, and the ordinate represents equivalent relative dielectric constant $\epsilon_r$ and shortening coefficient of wavelength $1/(\epsilon_r)^{1/2}$. Here, relative dielectric constant $\epsilon_1$ of dielectric plate 13 is assumed to be 4, and relative dielectric constant $\epsilon_2$ of the space between dielectric plate 13 and radial antenna 30 is assumed to be 1.

As can be seen from this figure, when dielectric occupation ratio $\alpha$ changes, the equivalent relative dielectric constant $\epsilon_r$ outside radial antenna 30 changes, and shortening coefficient of wavelength $1/(\epsilon_r)^{1/2}$ changes. Accordingly, the wavelength $\lambda_g$ of the electromagnetic field in recessed portion 18 also changes. The dielectric occupation ratio $\alpha$ changes in accordance with the thickness $d_1$ of dielectric plate 13 or the interval $d_2$ between dielectric plate 13 and radial antenna 30. Therefore, by way of example, by changing the interval $d_2$ between dielectric plate 13 and radial antenna 30 by moving radial antenna 30 upward/downward, it is possible to change the wavelength $\lambda_g$ such that the distances $L_1$ and $L_2$ attain approximately to $\lambda_g/2$.

An operation of the etching apparatus shown in FIG. 1 will be described.

The inside of processing container 11 is evacuated to a degree of vacuum of about 0.01 to about 10 Pa, with substrate 21 placed on the upper surface of mounting table 22. While maintaining the degree of vacuum, Ar as the plasma gas and $CF_4$ as the etching gas are supplied. In this state, the electromagnetic field from high frequency generator 45 is supplied through rectangular wave-guide 43, rectangular coaxial transducer 42 and coaxial line 41 to radial antenna 30.

The electromagnetic field introduced to radial antenna 30 propagates radially from the central portion to the outer periphery of radial wave-guide 33 while being emitted little by little through a plurality of slots 36. The electromagnetic field F emitted from radial antenna 30 passes through dielectric plate 13 and introduced into processing container 11 to cause electrolytic dissociation of Ar in processing container 11, generate plasma in the space S2 above substrate 21 and to dissociate $CF_4$.

The plasma has its energy and anisotropy controlled by a bias voltage applied to mounting table 22, and it is utilized together with radical $CF_x(x=1, 2, 3)$ adhered to substrate 21 for the etching process.

Similar to the conventional example, the electromagnetic field F1 not absorbed by the generated plasma but reflected and the electromagnetic field F2 not directly introduced from radial antenna 30 to processing container 11 are repeatedly reflected between the emitting surface (conductor plate 31) of radial antenna 30 and the plasma surface, forming a standing wave.

In the etching apparatus, as shown in FIG. 2, the distance $L_1$ from the edge 11A of processing container 11 to the inner surface of shield member 12 is approximately $\lambda_g/2$. Therefore, the position of edge 11A approximately corresponds to a node of the standing wave. Therefore, the voltage between edge 11A and the emitting surface (conductor plate 13) at the opposing position attains approximately zero, and hence, abnormal discharge does not occur at edge 11A. Thus, contamination of processing container 11 caused by the abnormal discharge can be prevented.

Further, the distance $L_2$ from the inner surface of shield member 12 to O-ring 14 is also approximately $\lambda_g/2$. Therefore, the position of O-ring 14 also approximately corresponds to a node of the standing wave, where the electromagnetic field of the standing wave is weak. Accordingly, the influence of the standing wave to O-ring 14 becomes smaller. Thus, the life of O-ring 14 can be made longer.

In the foregoing, an example has been described in which the distance $L_1$ from edge 11A of processing container 11 to the inner surface of shield member 12 is approximately $\lambda_g/2$. What is necessary is simply that the edge 11A is approximately positioned at the node of the standing wave, and therefore, the distance $L_1$ may be about N/2 times $\lambda_g$ (N is an integer not smaller than 1).

Similarly, the distance $L_2$ from the inner surface of shield member 12 to O-ring 14 should approximately be M/2 times $\lambda_g$ (M is an integer not smaller than 0 and not larger than N). It is noted, however, that when N≠M, it follows that the bulge of the standing wave exists on the inner side of processing container 11 when viewed from O-ring 14. If an abnormal discharge should occur, metal atoms dissociated from processing container 11 by electron impact would dissipate in processing container 11 and contaminate processing container 11. Therefore, it is desirable to set the values N=M, so that O-ring 14 is positioned slightly closer to the side of shield member 12 when viewed from edge 11A.

It is not necessary that distances $L_1$ and $L_2$ are exactly $\lambda_g \cdot N/2$ and $\lambda_g \cdot M/2$. Tolerable ranges of $L_1$ and $L_2$ will be described.

In a uniform electric field generated by parallel plate electrodes, the relation between electric field intensity $E_1$ and an equivalent distance D [cm] between electrodes when spark discharge is generated in an AC electric field is given by the following equation:

$$E_1=24.05\delta[1+[0.328/(\delta \cdot D)^{1/2}]][kV/cm] \quad (3)$$

Here, $\delta$ is referred to as relative air density, which represents air density with the air density at a normal temperature and atmospheric pressure (20° C., 1013 hPa) being 1, given by $$\delta=0.289p/(273+t) \quad (4)$$

Here, p represents pressure [hPa] and t represents temperature [° C.].

When the relation represented by the equation (3) is applied to the configuration shown in FIG. 2, the parallel plate electrodes that form the uniform electric field correspond to the upper surface of the sidewall of processing container 11 and the emitting surface (conductor 31) of radial antenna 30. Therefore, equivalent distance D between electrodes in equation (3) corresponds to the diameter of recessed portion 18. Here, the vacuum portion between the upper surface of the sidewall and dielectric plate 13 is neglected, and hence, equivalent distance D between electrodes is given by $$D=(\epsilon_1)^{1/2} \cdot d_1 + (\epsilon_2)^{1/2} \cdot d_2 \quad (5)$$

With the value D being set to infinite in equation (3), the electric field intensity $E_2$ when a spark discharge occurs in a non-uniform electric field is given, as represented by the following equation.

$$E_2=24.05\delta[kV/cm] \quad (6)$$

This represents the condition when a spark discharge occurs at the edge 11A of the inner surface of the sidewall of processing container 11.

The ratio between equations (3) and (6) will be $$\Gamma=E_1/E_2=1+[0.328/(\delta \cdot D)^{1/2}] \quad (7)$$

When the voltage at edge 11A is not higher than (1/Γ) of the peak voltage, it is considered that discharge at edge 11A would not occur. The angle θ at which the voltage attains to 1/Γ of the peak voltage is given by $$\theta=\sin^{-1}(1/\Gamma)[°] \quad (8)$$

and therefore, the tolerable value ΔL of $L_1$ and $L_2$ is $$\Delta L=(\theta/360) \cdot \lambda_g \quad (9)$$

Accordingly, the values $L_1$ and $L_2$ may be set to be in the following ranges.

$$(N/2) \cdot \lambda_g - \Delta L < L_1 < (N/2) \cdot \lambda_g + \Delta L \quad (10)$$

$$(M/2) \cdot \lambda_g - \Delta L < L_2 < (M/2) \cdot \lambda_g + \Delta L \quad (11)$$

A specific example will be described. In the configuration shown in FIG. 2, when there are quartz glass (dielectric plate 13) having the thickness of $d_1$=3.1 [cm] and relative dielectric constant $\epsilon_1$=3.8 and air (space between dielectric plate 13 and radial antenna 30) having the thickness of $d_2$=0.5 [cm] and relative dielectric constant $\epsilon_1$=1.0 between the electrodes, equivalent distance D between electrodes is 6.5 [cm] according to equation (5). When pressure p=1013 [hPa] and temperature t=40 [° C.] in equation (4), θ=61.9 [°] from equations (7) and (8). Here, equivalent relative dielectric constant $\epsilon_r$ between the electrodes is 2.73 according to equation (1), and therefore, according to equation (2), the wavelength $\lambda_g$ of the electromagnetic field having the frequency of 2.45 [GHz] is 7.4 [cm]. Therefore, the tolerable ranges of $L_1$ and $L_2$ are as follows, by inputting values θ and $\lambda_g$ into equations (9) to (11).

$$(3.7 \cdot N-1.27)[cm] < L_1 < (3.7 \cdot N+1.27)[cm]$$

$$(3.7 \cdot M-1.27)[cm] < L_2 < (3.7 \cdot M+1.27)[cm]$$

where $L_1$ and $L_2$ are both positive values.

The condition above is a limitation determined to prevent discharge, and it is not the case that dissociation of metal atoms from processing container 11 by impact of electrons in the plasma is prevented.

Second Embodiment

Figure 4:
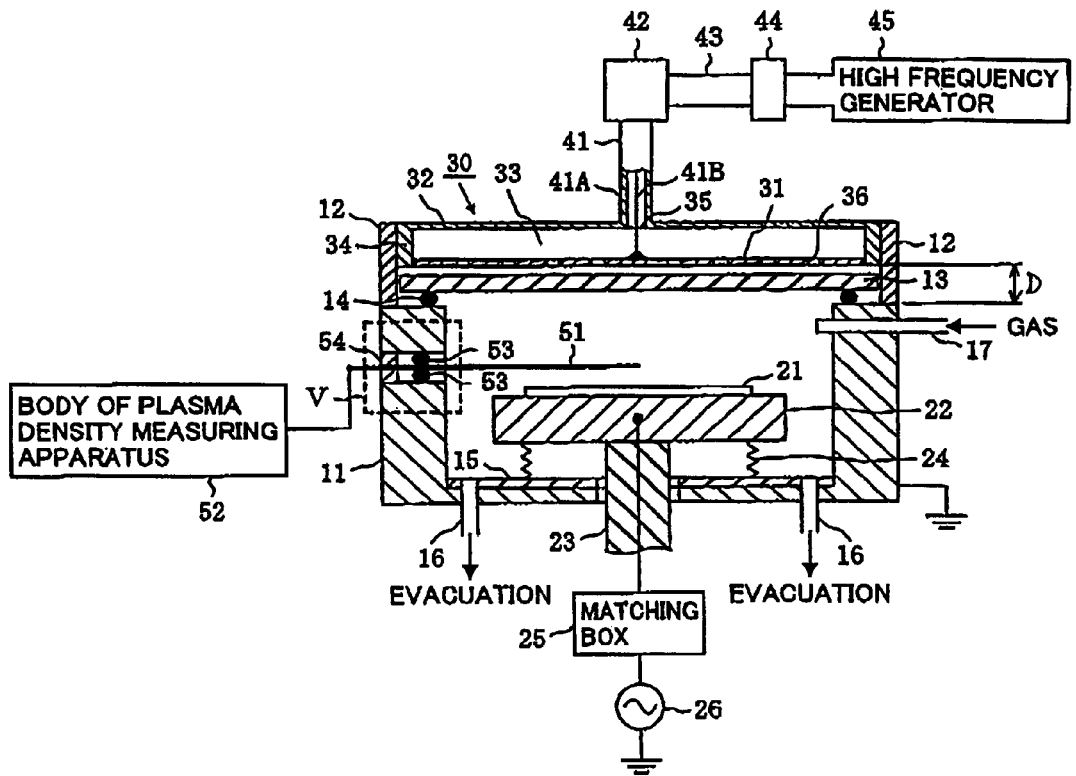
FIG. 4 represents a configuration of an etching apparatus in accordance with a second embodiment of the present invention.
Figure 5:
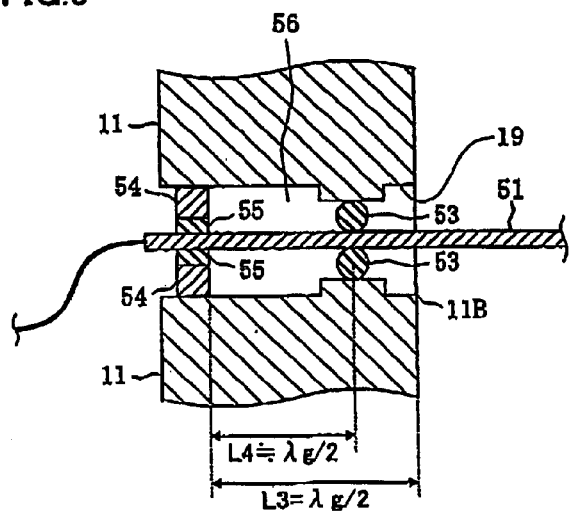
FIG. 5 is a cross section showing, in enlargement, a portion V surrounded by dotted lines in FIG. 4.

FIG. 4 represents a configuration of an etching apparatus in accordance with a second embodiment of the present invention. In the figure, portions similar to those of FIG. 1 will be denoted by the same reference characters and description thereof will appropriately be omitted. FIG. 5 is a cross section showing, in enlargement, a portion V surrounded by dotted lines in FIG. 4.

The etching apparatus shown in FIG. 4 has a circular through hole 19 formed in a sidewall of processing container 11, through which a conductor probe 51 for measuring plasma density is inserted. Probe 51 is arranged at the central axis of through hole 19, and together with the inner surface of through hole 19, forms a coaxial line. A coaxial line does not have high-frequency cut-off, and therefore, it is often used for plasma density measurement in a high frequency plasma apparatus. Probe 51 has one end connected to the body of plasma density measuring apparatus arranged outside of processing container 11, and the other end extending to the inside of processing container 11.

Through hole 19 formed in the sidewall of processing container 11 is tightly sealed by an O-ring 53 as a sealing member interposed on probe 51, so that air-tightness of processing container 11 is ensured.

Further, that side of through hole 19 which is on the side of the outer surface of the sidewall is closed by means of a shield member 54, and an electric field going to the outside of processing container 11 through this hole is shielded. Probe 51 is taken out of processing container 11 through the central portion of shield member 54, and an insulating member 55 such as shown in FIG. 5 is interposed to prevent contact between probe 51 and shield member 54.

When wavelength of an electric field in a recessed portion 56 formed by the inner surface of through hole 19 and the inner surface of shield member 54 is represented as $\lambda_g$, shield member 54 is arranged such that the distance $L_3$ from an edge 11B of the inner surface of the sidewall of processing container 11 to the inner surface of shield member 54 (that is, the depth from an opening of recessed portion 56 to the end surface) is approximately N/2 times $\lambda_g$. Further, O-ring 14 is arranged such that the distance $L_4$ from the inner surface of shield member 12 is approximately M/2 times $\lambda_g$. The tolerable range of $L_3$ is represented by equation (10) above with the value $L_1$ replaced by $L_3$, and the range of $L_4$ is represented by equation (11) above with the value $L_2$ replaced by $L_4$.

Because of the foregoing, even when a standing wave appears in the recessed portion 56, abnormal discharge does not occur at edge 11B, and therefore, contamination of processing container 11 can be suppressed. Further, as the electric field of the standing wave is weak at the position of O-ring 54, the life of O-ring 54 can be made longer.

Third Embodiment

Figure 6:
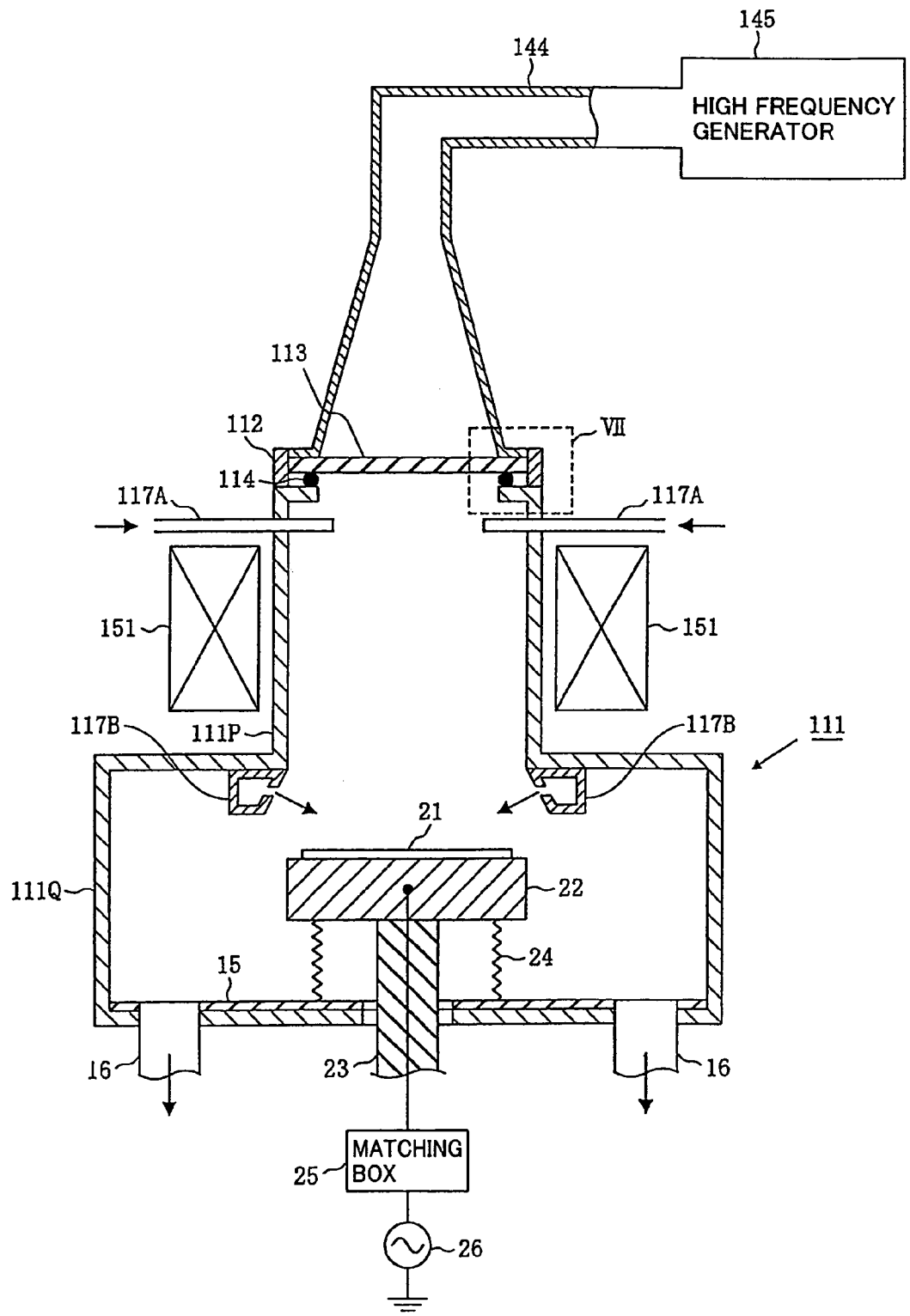
FIG. 6 represents a configuration of an ECR etching apparatus in accordance with a third embodiment of the present invention.

The present invention is also applicable to an ECR etching apparatus that etches substrates using electron cyclotron resonance (ECR). FIG. 6 represents a configuration of an ECR etching apparatus in accordance with a third embodiment of the present invention. In the figure, portions similar to those of FIG. 1 will be denoted by the same reference characters and description thereof will appropriately be omitted.

As shown in FIG. 6, the etching apparatus has a vacuum container 111 that includes a plasma chamber 111P having an electromagnetic coil forming a mirror magnetic field provided therearound, and a reaction chamber 111Q containing a substrate 21 as an object of processing. At an upper portion of plasma chamber 111P, a gas supply nozzle 117A supplying a plasma gas such as Ar is provided, and at an upper portion of reaction chamber 111Q, an annular gas supply portion 117B supplying an etching gas such as $CF_4$ is provided.

At an opening at the upper portion of plasma chamber 111P, a dielectric plate 113 is arranged. Dielectric plate 113 is supported by an upper surface of the sidewall (end surface of vacuum container 111) that corresponds to the opening of plasma chamber 111P, and at the joint portion between the upper surface of the sidewall and a lower surface of the periphery of dielectric plate 113, an O-ring 114 is interposed as a sealing member.

On dielectric plate 113, a wave-guide 144 is arranged, connected to a high frequency generator 145 generating a high frequency electromagnetic filed. In the ECR etching apparatus, wave-guide 144 and high frequency generator 145 constitute electromagnetic field supplying means. Further, on the upper surface of the sidewall of vacuum container 111, an annular shield member 112 is arranged, surrounding the outer periphery of dielectric plate 113.

Figure 7:
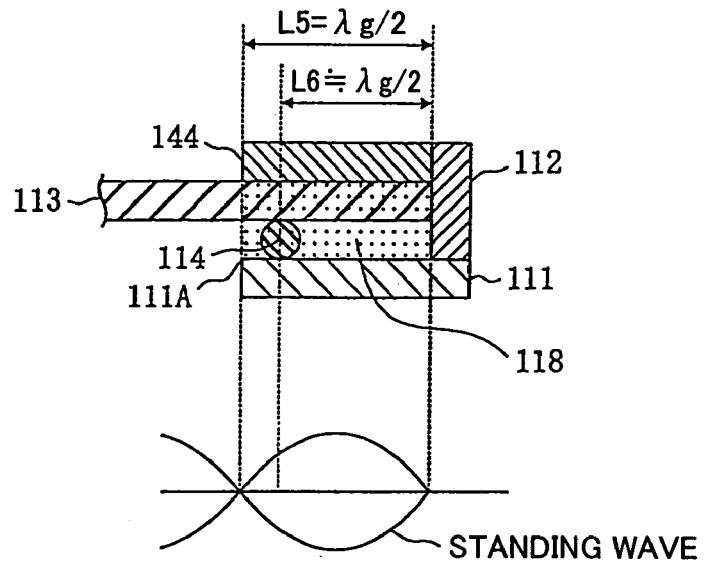
FIG. 7 is a cross section showing, in enlargement, a portion VII surrounded by dotted lines in FIG. 6.
Figure 8:
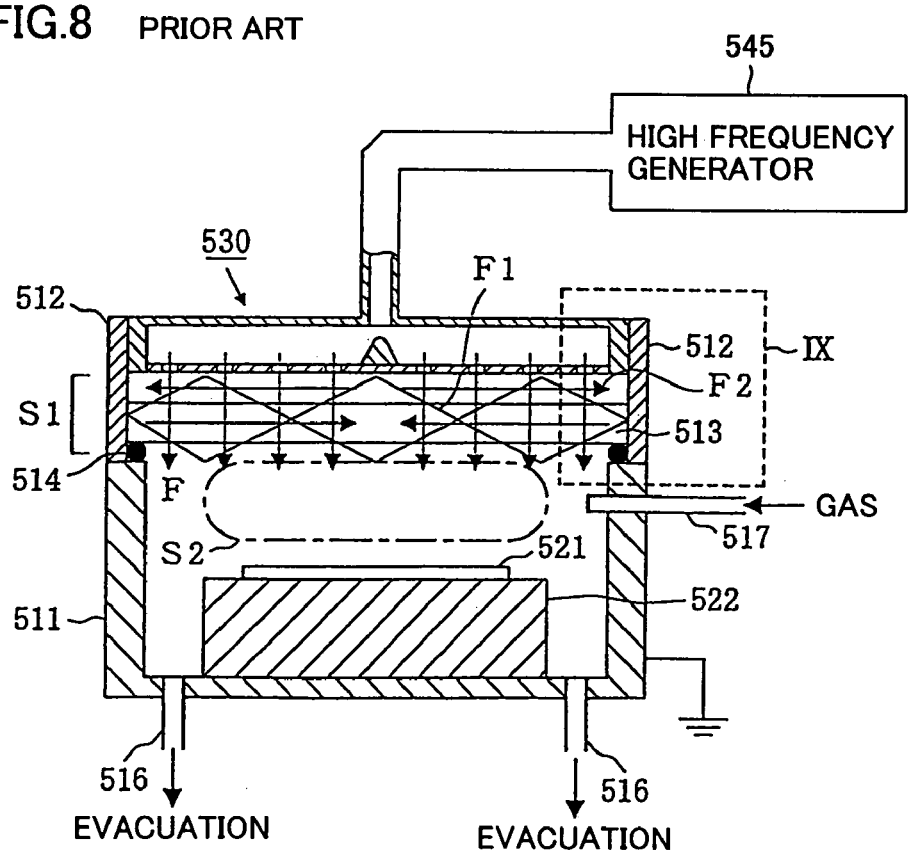
FIG. 8 represents an exemplary configuration of a conventional high frequency plasma apparatus.
Figure 9A:
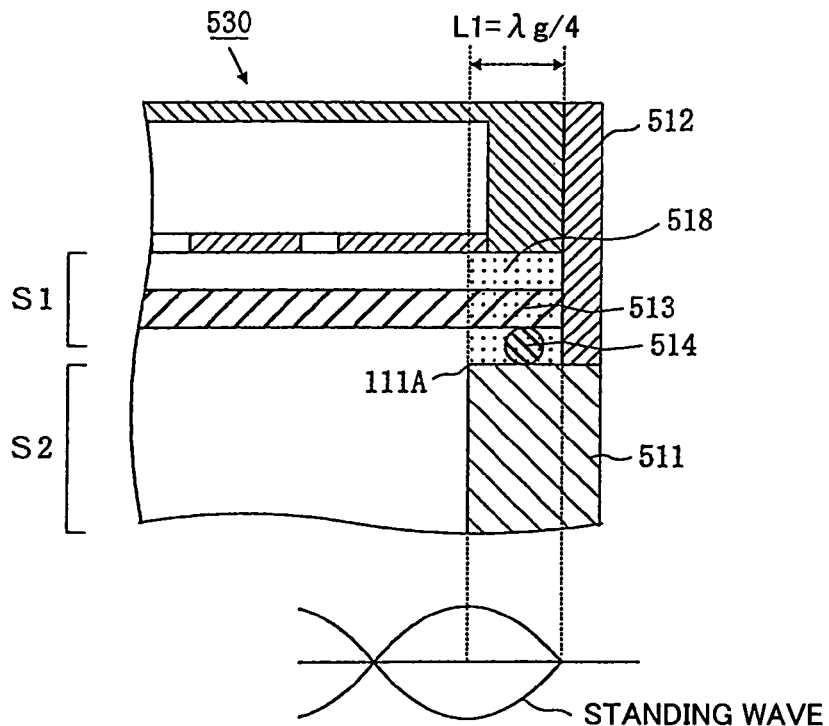
FIGS. 9A and 9B are cross sections showing, in enlargement, a portion IX surrounded by dotted lines in FIG. 8.
Figure 9B:
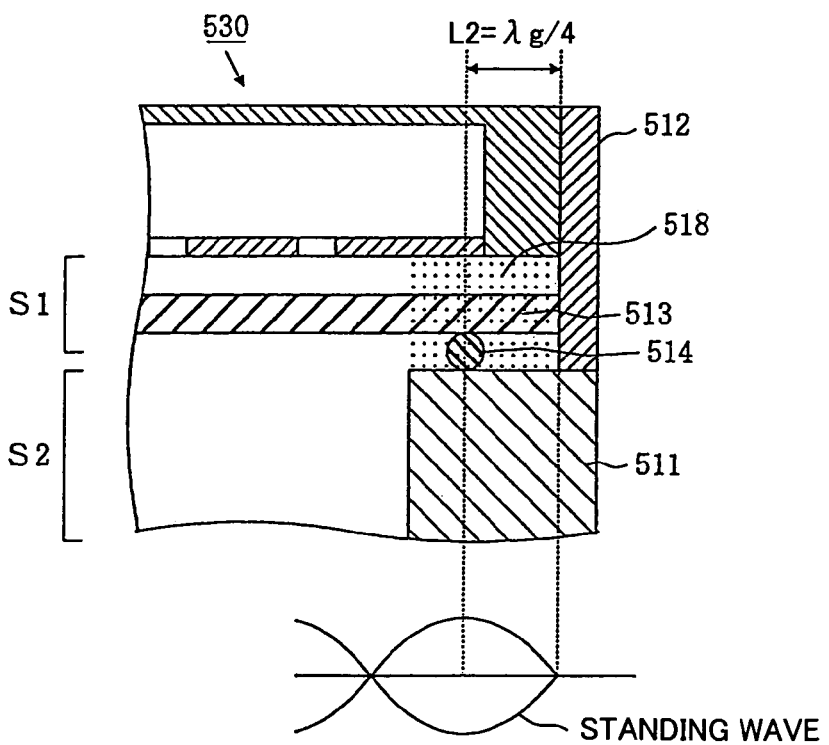

FIG. 7 is a cross section showing, in enlargement, a portion VII surrounded by dotted lines in FIG. 6.

When the wavelength of the electromagnetic field in a recessed portion 118 (dotted area in FIG. 7) formed by the upper surface of the sidewall of vacuum container 111, the lower surface of wave-guide 144 and the inner surface of shield member 112 is represented as $\lambda_g$, shield member 112 is arranged such that the distance $L_5$ from an edge 111A of an inner surface of the sidewall of vacuum container 111 to the inner surface of shield member 112 (that is, depth from an opening of recessed portion 118 to an end surface) is approximately $\lambda_g/2$. Further, O-ring 114 is arranged at a distance $L_6$, slightly shorter than $\lambda_g/2$, from the inner surface of shield member 112. The tolerable range of $L_5$ is represented by equation (10) above with the value $L_1$ replaced by $L_5$, and the range of $L_6$ is represented by equation (11) above with the value $L_2$ replaced by $L_6$.

Because of the foregoing, even when a standing wave appears in the recessed portion 118, abnormal discharge does not occur at edge 111A, and therefore, contamination of vacuum container 111 can be suppressed. Further, as the electric field of the standing wave is weak at the position of O-ring 114, the life of O-ring 114 can be made longer.

When a through hole through which a probe for measuring plasma density is inserted is provided in the sidewall of vacuum container 111, the positions where the shield member and the O-ring are arranged may be adjusted in the similar manner as described with reference to the second embodiment.

Though examples in which the plasma apparatus in accordance with the present invention is applied to an etching apparatus have been described in the foregoing, it is needless to say that the invention may be applied to other plasma apparatus, such as a plasma CVD apparatus.

As described above, in the present invention, in an area surrounded by the end surface of the container, the electromagnetic field supplying means and the shield member, the distance from the inner surface of the container to the inner surface of the shield member is adjusted to be approximately N/2 (N is an integer not smaller than 1) times the wavelength of the electromagnetic field in the area. Consequently, the position of the inner surface of the container comes to approximately correspond to a node of the standing wave generated in the area, and the voltage at this position attains approximately zero. Accordingly, abnormal discharge at the position of the inner surface of the container is prevented, and contamination of the container can be prevented.

Further, in the present invention, a sealing member is arranged at a position away from the inner surface of the shield member, by a distance of approximately M/2 (M is an integer not smaller than 0 and not larger than N) times the wavelength of the electromagnetic field in the area. This position approximately corresponds to a node of the standing wave generated in the area, and the electromagnetic field of the standing wave is weak. Therefore, the life of the sealing member can be made longer.

When the electromagnetic field supplying means is implemented by an antenna positioned opposite to the dielectric member, the wavelength of the electromagnetic field in the area surrounded by the end surface of the container, the antenna and the shield member is adjusted by changing the interval between the dielectric member and the antenna. Even when the distance between the inner surface of the container and the inner surface of the shield member is physically constant, the aforementioned distance can be set approximately to N/2 times the wavelength of the electromagnetic field, as the wavelength of the electromagnetic field in the area is adjusted by changing the interval between the dielectric member and the antenna.

From the same reason, even when the position where the sealing member is arranged is physically fixed, the distance from the inner surface of the shield member to the position of arrangement of the sealing member can be set approximately to M/2 times the wavelength of the electromagnetic field, by changing the interval between the dielectric member and the antenna.

Further, in the present invention, in the through hole of the container, the distance from the inner surface of the container to the inner surface of the shield member is adjusted to be approximately N/2 (N is an integer not smaller than 1) times the wavelength of the electromagnetic field in the through hole. Therefore, the position of an inner surface of the container comes to approximately correspond to a node of a standing wave generated in the through hole, and the voltage at this position approximately attains to zero. Thus, abnormal discharge does not occur at a position of the inner surface of the container, and contamination of the container can be prevented.

Further, in the present invention, the sealing member is arranged at a position away from the inner surface of the shield member, by a distance of approximately M/2 (M is an integer not smaller than 0 and not larger than N) times the wavelength of the electromagnetic field in the through hole. This position approximately corresponds to a node of a standing wave formed in the through hole, and the electromagnetic field of the standing wave is weak. Therefore, the life of the sealing member can be made longer.

INDUSTRIAL APPLICABILITY

The present invention may be applied to a plasma apparatus for processes such as oxide film formation, crystal growth of a semiconductor layer, etching and ashing, in manufacturing semiconductor devices or flat panel displays.

The invention claimed is:
1. A plasma apparatus, comprising:
a container (11) having an opening;
a dielectric member (13) supported by an end surface of an outer periphery of the opening of said container and closing said opening;
an antenna for supplying an electromagnetic field from said opening into said container through the dielectric member; and
a shield member (12) extending at least between the end surface of said container and said antenna, covering an outer periphery of said dielectric member and shielding said electromagnetic field; wherein
a distance from an inner surface of said container at the end surface of said container to an inner surface of said shield member corresponds to approximately N/2 (N is an integer not smaller than 0) times the wavelength of said electromagnetic field in an area surrounded by the end surface of said container, said antenna and said shield member, such that a distance L1 from the inner surface of said container to the inner surface of said shield member satisfies the relation:

$(N/2) \cdot \lambda_g - \Delta L < L_1 < (N/2) \cdot \lambda_g + \Delta L$, where $L_1 > 0$, $\Delta L = (\theta/360) \cdot \lambda_g$, $\theta = \sin^{-1}(1/\Gamma)$, and $\Gamma = 1 + \{0.328/(\delta \cdot D^{1/2})\}$, wherein D is a distance between the end surface of said container (11) and said antenna,
$\delta$ is the relative air density in said area, and
$\lambda_g$ is a wavelength of said electromagnetic field in said area.

2. The plasma apparatus according to claim 1, further comprising:
a sealing member (14) interposed at a joint portion between the end surface of said container (11) and said dielectric member (13) for tight-sealing the joint portion; wherein
the sealing member is arranged at a position away from the inner surface of said shield member by a distance approximately M/2 (M is an integer not smaller than 0 and not larger than N) times the wavelength of said electromagnetic field.

3. The plasma apparatus according to claim 2, wherein when a distance between the end surface of said container and said antenna is represented by D, relative air density in said area is represented by $\delta$ and wavelength of said electromagnetic field in said area is represented by $\lambda_g$, a distance $L_2$ from the inner surface of said shield member to the position of said sealing member satisfy the relation of $(M/2) \cdot \lambda_g - \Delta L < L_2 < (M/2) \cdot \lambda_g + \Delta L$ where $L_2 > 0$, $\Delta L = (\theta/360) \cdot \lambda_g$, $\theta = \sin^{-1}(1/\Gamma)$ $\Gamma = 1 + \{0.328/(\delta \cdot D^{1/2})\}$.

* * * * *